United States Patent
Werth et al.

(10) Patent No.: US 11,366,180 B2
(45) Date of Patent: Jun. 21, 2022

(54) UPDATING A DEFAULT SWITCHING LEVEL

(71) Applicant: Infineon Technologies AG, Neubiberg (DE)

(72) Inventors: Tobias Werth, Villach (AT); Cosmin Filip, Bucharest (RO); Catalina-Petruta Juglan, Bucharest (RO); Silviu-Antonio Pieleanu, Bucharest (RO)

(73) Assignee: Infineon Technologies AG

( * ) Notice: Subject to any disclaimer, the term of this patent is extended or adjusted under 35 U.S.C. 154(b) by 0 days.

(21) Appl. No.: 17/163,803

(22) Filed: Feb. 1, 2021

(65) Prior Publication Data
US 2021/0247467 A1    Aug. 12, 2021

(30) Foreign Application Priority Data
Feb. 6, 2020   (DE) .............................. 102020201441

(51) Int. Cl.
*G01R 33/00*    (2006.01)
*G01R 33/07*    (2006.01)

(52) U.S. Cl.
CPC ..... *G01R 33/0041* (2013.01); *G01R 33/0088* (2013.01); *G01R 33/07* (2013.01)

(58) Field of Classification Search
CPC . G01R 33/0041; G01R 33/0088; G01R 33/07
See application file for complete search history.

(56) References Cited

U.S. PATENT DOCUMENTS

| | | | |
|---|---|---|---|
| 10,845,433 B2 | 11/2020 | Werth et al. | |
| 2013/0177040 A1* | 7/2013 | Foletto | G01D 5/2449 374/142 |
| 2014/0266176 A1* | 9/2014 | Fernandez | G01R 1/44 324/244 |
| 2015/0061656 A1* | 3/2015 | Fernandez | G01D 5/2448 324/207.25 |
| 2015/0243461 A1* | 8/2015 | Werth | F02P 7/067 307/116 |
| 2017/0307696 A1* | 10/2017 | Werth | G01R 33/0088 |

FOREIGN PATENT DOCUMENTS

| | | |
|---|---|---|
| DE | 102016206686 A1 | 10/2017 |
| JP | 2000357216 A | 12/2000 |

* cited by examiner

*Primary Examiner* — Alvaro E Fortich
(74) *Attorney, Agent, or Firm* — Design IP

(57) ABSTRACT

A magnetic field sensor apparatus includes a sensor signal generator generating a sensor signal responsive to a magnetic field. A switching level provider provides during a power up mode a switching level based on a most recently updated valid one of a first and a second value of a default switching level. If an update triggering condition occurs, the not most recently updated one of the first and second values of the default switching level is updated and the most recently updated one of the first and second values of the default switching level is maintained unchanged until a next update triggering condition occurs, so that the first and second values of the default switching level are updated alternately on consecutive triggering conditions.

27 Claims, 6 Drawing Sheets

UPDATING A DEFAULT SWITCHING LEVEL

FIELD

The present application relates to the field of magnetic field sensors and, in particular, to an apparatus and a method for updating a default switching level which a sensor signal is compared to upon power-on of a magnetic field sensor device.

BACKGROUND

In magnetic field sensor arrangements for detecting the position of a mechanical element, such as camshaft position sensor arrangements, it is important, after the operating voltage has been switched on, to detect the position of a mechanical element in order to achieve accurate measurements. In the case of a Hall sensor for camshaft configurations, for example, the position of a camshaft should be detected as accurately as possible after the operating voltage has been switched on, i.e. whether it is a tooth gap (notch) or a tooth of the target wheel which is facing the sensor.

In magnetic field sensor arrangements, a sensor signal is compared to a threshold representing a switching level. Edges or pulses are generated in an output signal of the magnetic field sensor arrangement when the sensor signal exceeds or crosses the switching level. In order to achieve phase accuracy for first edges in the output signal, the switching level is to be set as early as possible upon power on of the magnetic field sensor arrangement. A TPO switching level, TPO=true power on, may be pre-programmed during production of the magnetic field sensor arrangement, such as upon attaching a sensor to a back bias magnet. Thus, the sensor arrangement may be calibrated to a maximum air gap after mounting the sensor to the sensor arrangement to compensate for mounting tolerances. This is done before the sensor arrangement is later mounted in the actual application, such as relative to a target wheel. The pre-programmed TPO switching level may be used later upon mounting the sensor arrangement in the actual application when the magnetic field sensor arrangement is powered on the first time or at other opportunities. The process of pre-programming the TPO switching level is done in advance (cheaper and easier) and, therefore, an entire possible air-gap spread has to be taken into consideration. During operation upon mounting the sensor arrangement in the actual application, such as in a vehicle, a switching level regulation starts from the pre-programmed TPO switching level and based on the field modulation seen by the passing target wheel, wherein the switching level regulation generates a switching level with better phase accuracy. Using the TPO switching level, in some cases, a phase error is higher for the first switching than it is for later regulated switching. A temperature coefficient may be stored along with the switching level. Generally, the idea of threshold adaptation may be to cover for a mechanical spread of the mounting (air-gap variation) and for magnet/sensor process and temperature variations.

Some magnetic field sensor devices store calibration information during operation in volatile memory powered by a capacitor used to store energy and supply power to the volatile memory during short power-downs or other losses of power of the device in order to improve EMC (electromagnetic compatibility) performance. Using this information rather than default information may enable a faster restart. It is verified whether the stored information is valid before it is used.

In other magnetic field sensor arrangements, a regulated switching threshold is stored in a non-volatile storage module after mounting the magnetic field sensor arrangement at its final destination, such as an engine. This stored regulated switching threshold is then used as initial switching threshold at subsequent power-on moments. A new regulated switching threshold is stored at two different instances one after the other using a programming procedure so as to make sure that one of the instances is valid even in case power is lost during the programming procedure. If successful, the new regulated switching threshold is stored in both instances after the programming procedure. Such an approach is described in US 2017/0307696 A1.

According to US 2017/0307696 A1 a calibrated switching level is calculated during the regular operation and the storage module is updated whenever the difference between a currently stored value and the current calibrated switching threshold is larger than a percentage of the peak to peak magnetic field amplitude of the detected magnetic field. Additionally or optionally, the storage update may be made only when—the target wheel rotation speed is higher than a minimum speed in order to avoid updating as a result of vibrations or start-stop backward-forward rotation, —there have been at least a minimum number of target wheel rotations since power up in order to allow functional testing scenarios, —the temperature is within some min/max limits to ensure safe programming, —the calibrated switching threshold has been stable for a few consecutive rotations to avoid re-programming as a results of some temporary magnetic disturbance, —a maximum allowed number of programming operations has not been exceeded to avoid damaging the nonvolatile memory, and—when triggered by an ECU which could also provide an external programming voltage, if necessary According to US 2017/0307696 A1, some information indicating the validity of the stored data may be stored additionally. Multiple storage units for redundancy may be provided to ensure validity of data when exposed to possible supply interruptions during programming. At each update, the device invalidates the first storage unit, updates the information in the first storage unit and then validates it again. Afterwards the same three operations are performed to update the second storage unit with the same calibrated switching threshold. Optionally old stored data may be moved to a different memory location when an update is made in order to keep a history of updates.

Accordingly, there is still room for improvements in achieving phase accuracy for first edges in an output signal of a magnetic filed sensor arrangment upon power-on of the arrangment in a resource saving manner.

SUMMARY

Examples of the present disclosure provide a magnetic field sensor apparatus including a sensor signal generator, a switching level provider, a comparator and a non-volatile storage module. The sensor signal generates a sensor signal responsive to a magnetic field. The switching level provider provides, during a power up mode, a switching level based on a most recently updated valid one of a first value of a default switching level and a second value of a default switching level, and to calculate, during a running mode, the switching level based on the sensor signal. The comparator compares the sensor signal to the switching level to generate an output signal of the magnetic field sensor apparatus. The non-volatile storage module is configured to store the first value of the default switching level and the second value of the default switching level and, if an update triggering condition occurs, update the not most recently updated one of the first value and second values of the default switching level and maintain most recently updated one of the first and second values of the default switching level unchanged until a next update triggering condition occurs, so that the first and second values of the default switching level are updated alternately on consecutive triggering conditions.

Examples of the present disclosure provide a method of updating a default switching level in a magnetic field sensor apparatus, the magnetic field sensor apparatus including a sensor signal generator configured to generate a sensor signal responsive to a magnetic field, a switching level provider configured to provide a switching level, wherein the switching level provider is configured to provide, during a power up mode, the switching level based on a most recently updated valid one of a first value of a default switching level and a second value of a default switching level, and to calculate, during a running mode, the switching level based on the sensor signal, a comparator configured to compare the sensor signal to the switching level, and a non-volatile storage module configured to store the first value of the default switching level and the second value of the default switching level. The method includes, if an update triggering condition occurs, updating the not most recently updated one of first and second values of the default switching level and maintaining the most recently updated one of the first and second values of the default switching level unchanged until a next update triggering condition occurs, so that the first and second values of the default switching level are updated alternately on consecutive triggering conditions.

According to the present disclosure, at each trigger condition, one of the two values is updated while the other value is maintained unchanged. In case both values are valid, the not most recently one is updated. If only one is valid and an update trigger condition occurs, the invalid one may be updated. If both values are invalid, a predetermined one may be updated. Thus, the number of updates of each value may be reduced by a factor of two when compared to a case in which each value is updated at each trigger condition. Thus, aging of the non-volatile storage module may be reduced. According to the present disclosure the first and second values are stored in a non-volatile storage module and, thus, an additional volatile memory for storing the values may be omitted.

BRIEF DESCRIPTION OF THE DRAWINGS

Examples of the disclosure will be described using the accompanying drawings, in which.

DETAILED DESCRIPTION

In the following, examples of the present disclosure will be described in detail using the accompanying drawings. It is to be pointed out that the same elements or elements that have the same functionality are provided with the same or similar reference numbers, and that a repeated description of elements provided with the same or similar reference numbers is typically omitted. Hence, descriptions provided for elements having the same or similar reference numbers are mutually exchangeable. In the following description, a plurality of details is set forth to provide a more thorough explanation of examples of the disclosure. However, it will be apparent to one skilled in the art that other examples may be practiced without these specific details. In other instances, well-known structures and devices are shown in block diagram form rather than in detail in order to avoid obscuring examples described herein. In addition, features of the different examples described herein may be combined with each other, unless specifically noted otherwise. While a number of actions are described referring to FIGS. 4 and 5 in a specific order, is to be noted that some of the actions may be optional and that the actions may be performed in a different order in other examples.

Figure 5A:
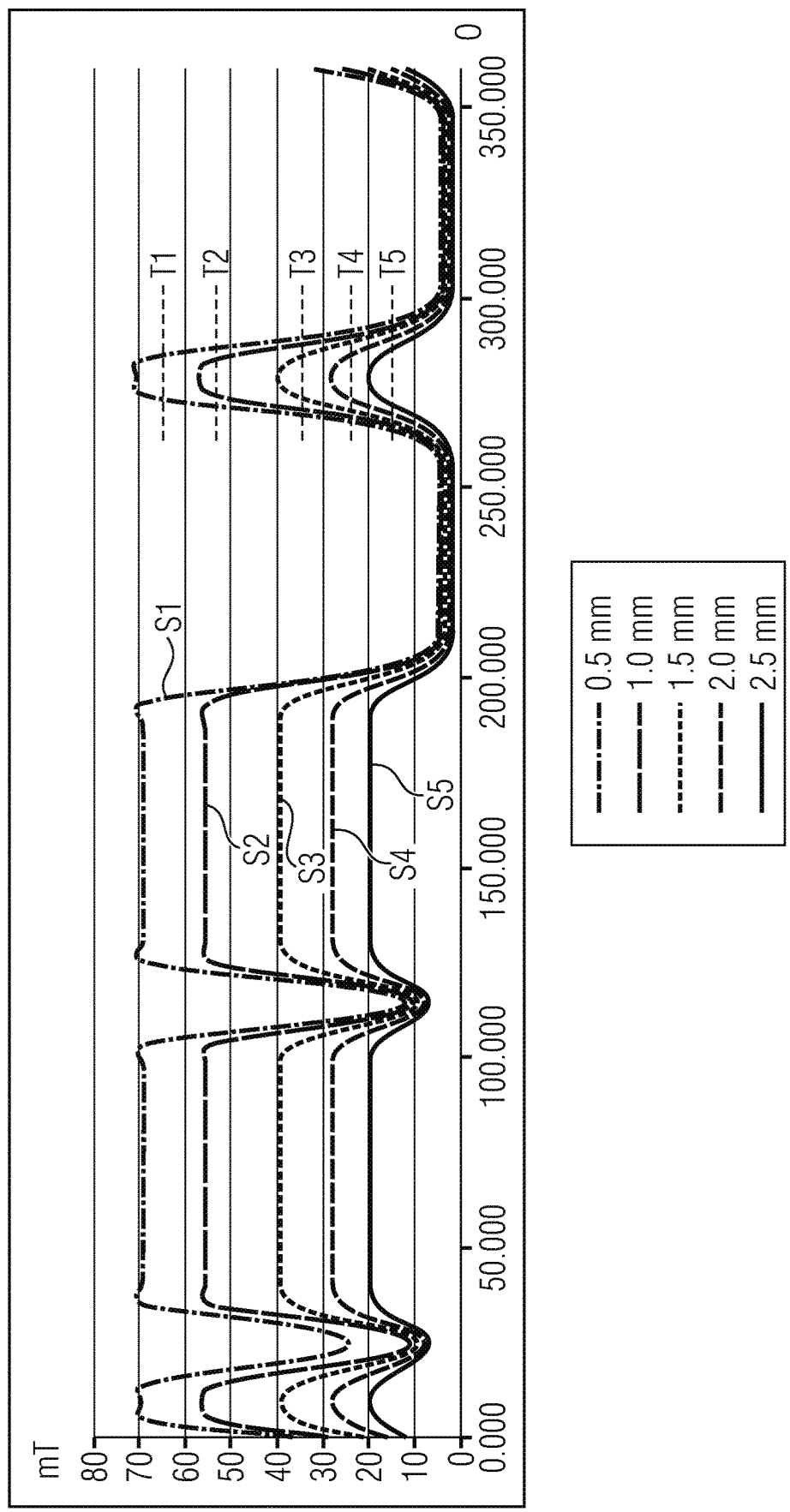
FIG. 5A shows a chart showing magnetic fields generated at the position of a magnetic field sensor in dependence on the distance between the magnetic field sensor and a target wheel generating the magnetic field.
Figure 5B:
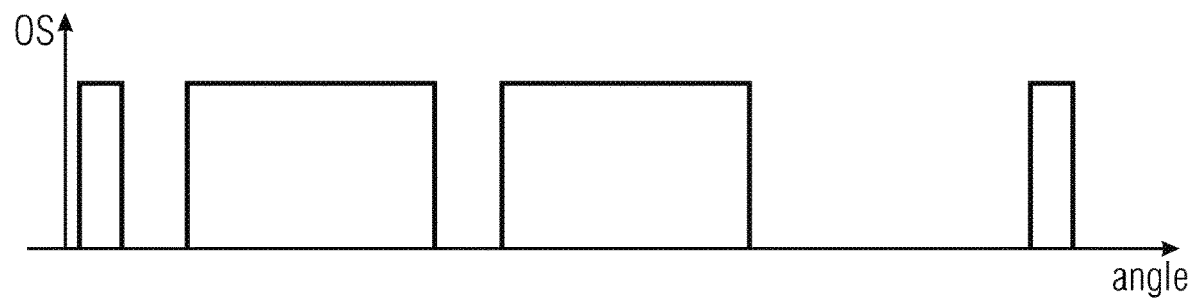
FIG. 5B shows an output signal of a magnetic field sensor detecting one of the magnetic fields in FIG. 5A.

FIG. 5A shows examples of sensor signals S1 to S5 of a magnetic field sensor located at different distances between 0.5 mm and 2.5 mm relative to a target wheel over one 360° rotation of the target wheel. The sensor signals S1 to S5 represent a magnetic field generated by the target wheel. The target wheel comprises four cam features having the same height but different widths and are located at approximately the same distance from the center of the target wheel. The target wheel may be arranged to rotate relative to a back-bias magnet to vary the magnetic field generated by the back-bias magnet. In other examples, the features of the target wheel may be magnetic. In examples, the target wheel may be a pole wheel. The target wheel generates a varying magnetic field when rotating. As can be seen from FIG. 5A, the peak amplitude of the sensor signals S1 to S5 depends on the distance from the target wheel. Thus, the switching threshold or switching level of a magnetic field sensor used to detect the magnetic field should be adapted depending on the distance of the magnetic field sensor from the target wheel in order to achieve an improved or optimum phase accuracy. Possible switching levels T1 to T5 for each signal S1 to S5 are indicated in FIG. 5A. In examples, the switching level may be at about 70% of the magnetic field amplitude but is shown at a different level in FIG. 5A for clarity reasons. FIG. 5B shows an output signal OS generated by a magnetic field sensor arrangement. The amplitude of the output signal OS depends on whether the sensor signal is above or below the respective threshold. Thus, the output signal OS has a high level if the sensor signal is above the associated switching level and has a low level if the sensor signal is below the associated switching level. In other examples, the output signal has a low level if the sensor signal is above the associated threshold and has a high level if the sensor signal is above the associated switching level. In other examples, a pulse may be generated in the output signal OS each time the sensor signal exceeds the threshold.

Figure 5C:
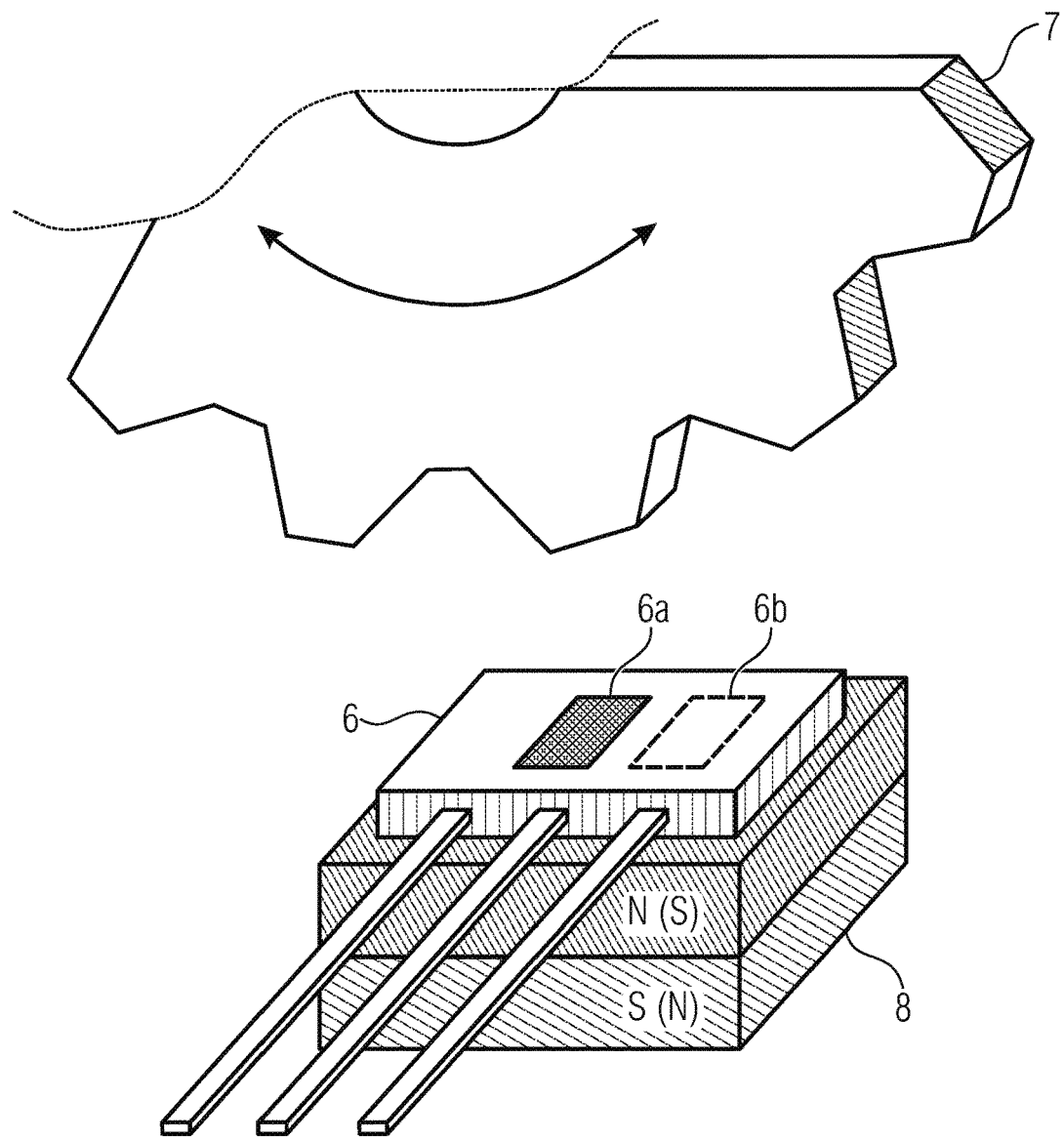
FIG. 5C shows a schematic view of a possible arrangement in which the magnetic field sensor apparatus may be used.

FIG. 5C shows a schematic view of a magnetic field sensor chip 6, a gear wheel 7 representing a target wheel, and a back-bias magnet 8. The gear wheel 7 has teeth influencing the magnetic field generated by the back-bias magnet 8. In the example shown, the magnetic field sensor chip comprises a sensor element 6a and signal processing circuitry 6b. The amplitude of the sensor signal of sensor element 6a depends on the air-gap between the magnetic field sensor chip and the back-bias magnet from the gear wheel. It is to be noted that the gear wheel 7 shown in FIG. 5C would result in a different signal when compared to the signal shown in FIG. 5A as a target wheel resulting in the signal shown in FIG. 5A comprises two narrow teeth and two wide teeth around its circumference, while gear wheel 7 comprises a larger number of regular teeth.

Figure 1:
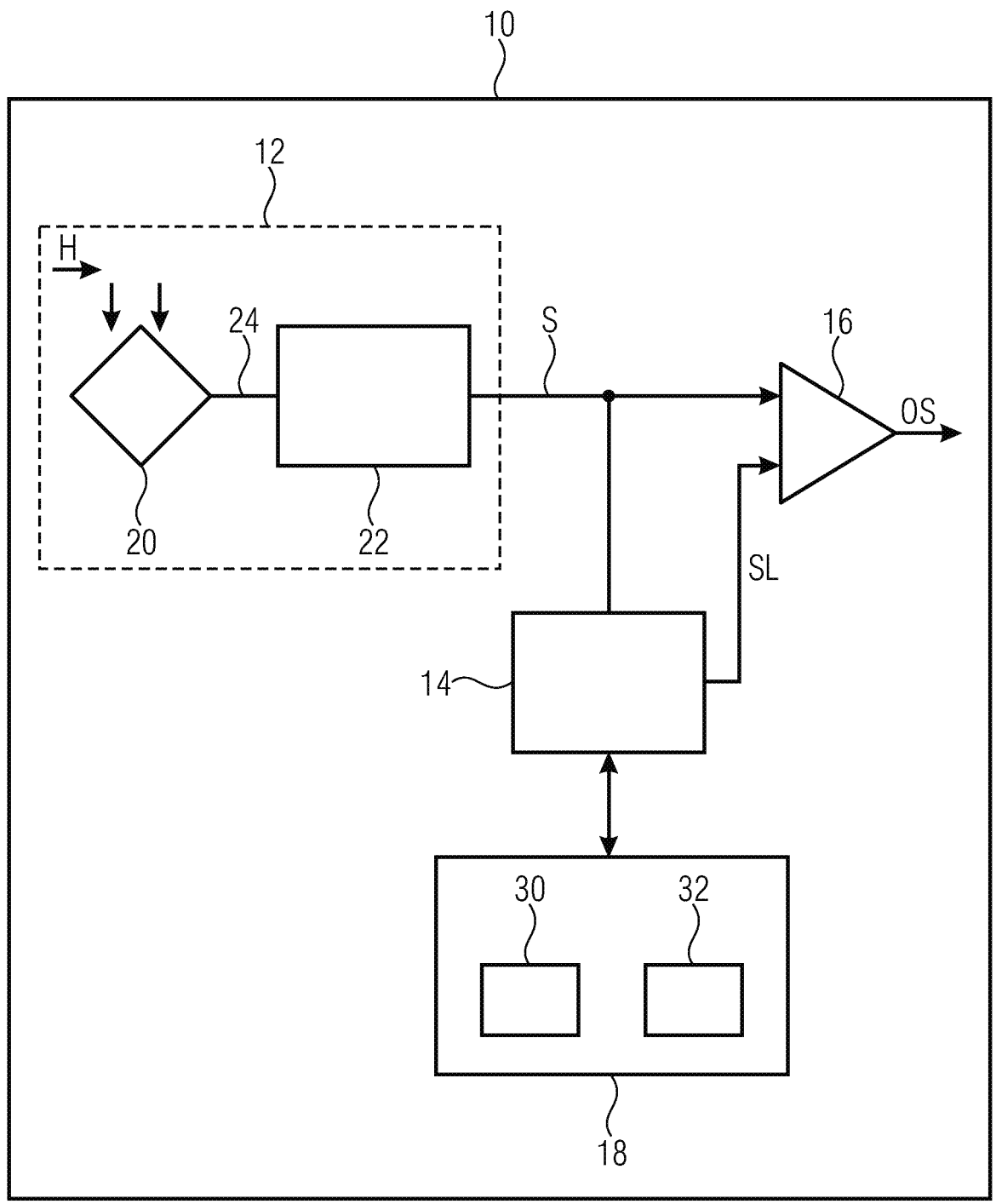
FIG. 1 shows a schematic diagram of a magnetic field sensor arrangement according to an example of the present disclosure.

FIG. 1 shows an example of a magnetic field sensor arrangement 10 according to the present disclosure, which comprises a sensor signal generator 12, a switching level provider 14, a comparator 16 and a non-volatile storage module 18. The sensor signal generator 12 generates a sensor signal S based on a magnetic field H. The sensor signal generator 12 may include a magnetic field sensor element 20 and a processing circuit 22.

The magnetic field sensor element 20 detects the magnetic field H and may comprise, but it is not limited to, a Hall effect element, a magneto-resistance element, or a magneto-transistor. A Hall effect element may comprise, for example, a planar Hall element, a vertical Hall element or a circular Hall element. Magneto-resistive (XMR) sensor elements may comprise any magneto-resistive structures such as AMR (anisotropic magneto-resistance) structures, GMR (giant magneto-resistance) structures or TMR (tunnel magneto-resistance) structures or magnetic tunnel junction (MTJ) structures. To summarize, the term "magnetic field sensor element" is used to describe a variety of electronic elements that can sense a magnetic field for a magnetic field component. Thus, the magnetic field sensor element may be suited for camshaft applications, so that its basic function may be to map either a tooth or a notch into a unique electrical output state, i.e. an amplitude or an amplitude information.

The processing circuit 22 is configured to receive and process a sensor element output signal 24 of sensor element 20 and to provide sensor signal S which is representative of the sensor element output signal 24. In examples, the processed sensor output signal S is an amplified and/or digitized (digital) representation of the (e.g., analog) sensor element output signal 24. To be more specific, the sensor element output signal 24 may be representative of the magnetic field amplitude and/or magnetic field absolute value, but may also contain overlaid signal path offset ripple, whereas the processed sensor signal S may maintain or provide the magnetic field amplitude and offset information, but the signal path offset ripple component may be reduced. Thus, the processed sensor signal S may provide a digital representation of the magnetic field amplitude. In examples, processing circuit 22 may provide the functionality of a chopper circuit and of an analogue to digital converter circuit. As far as further details of the processing circuit in examples of the present disclosure are concerned, reference may be made to the processing module described in US 2017/0307696 A1, the teaching of which is incorporated herewith by reference.

The switching level provider 14 is configured to provide a switching level SL. The switching level provider is configured to provide, during a power-up mode, the switching level SL based on a most recently updated valid one of a first value 30 of a default switching level and a second value 32 of a default switching level, which are stored in non-volatile storage module 18. If one of the values is invalid, the other one is the most recently updated valid one. If both values are invalid, the switching level provider 14 may be configured to provide the switching level SL based on a pre-programmed TPO switching level. During a running mode, the switching level provider 14 is configured to calculate the switching level SL based on the sensor signal S. As used herein, the term default switching level refers to a switching level that is stored in a non-volatile manner so as to be usable upon a next power up of the magnetic field sensor arrangement.

Accordingly, the magnetic field sensor arrangement 10 is configured to be operated in at least two different modes of operation, wherein a first or initial mode of operation after power up will be referred to as "power up mode" or as "initial mode" (e.g., true power on state (TPOS)). The operation following the initialization is referred to as "running mode", i.e. a normal operation with a running target wheel. The mode of operation may be changed from the power up mode to the running mode after a certain number of switching events, e.g., based on at least one revolution of the target wheel. The mode may be switched after the certain number of switching levels since the accuracy of a switching level calculated by the switching level provider 14 thereafter is considered to be sufficiently high. In examples, the mode may be switched after a certain pre-programmed number of target wheel features, such as a number of detected local minima and maxima of the magnetic field.

The comparator 16 is configured to receive the sensor signal S and the switching level SL, to compare the sensor signal S to the switching level SL, and to output an output signal OS depending on the result of the comparison. The output signal OS may have a first amplitude when the sensor signal S is exceeds the switching level SL and may have a second different amplitude when the sensor signal S does not exceed the switching level, such as shown in FIG. 5B. In other examples, the output signal OS may comprise a pulse or a pulse pattern each time the sensor signal S passes the switching level either in one direction or in both directions.

During normal operation, i.e. during the running mode, the switching level provider 14 is configured to calculate the switching level based on the sensor signal S, i.e., based on the sensed magnetic field amplitude. To this end, the switching level provider 14 may search for a minimum value (e.g., caused by a notch of a target wheel) and a maximum value (e.g., caused by a tooth of the target wheel) in the sensor signal S. Once the switching level provider has found a pair of min-max values (a peak-to-peak amplitude) the switching level provider may calculate an associated switching level. The switching level provider 14 may be configured to calculate a switching level at a fixed or variable percentage of the distance between minima and maxima of the detected field which is indicated by sensor signal S. The maximum value taken into consideration for switching level calculation can be an absolute maximum over one target wheel rotation or a function of all the local maxima seen over one target wheel rotation. Similarly, the minimum value taken into consideration for switching level calculation can be an absolute minimum over one target wheel rotation or a function of all the local minima seen over one target wheel rotation.

In order to provide a high accuracy of the comparator output signal OS (e.g., preferably immediately) after power on, the storage module 18 is configured to update, if an update triggering condition occurs, during the running mode, the not most recently updated one of the first value 30 and the second value 32 of the default switching level, which is currently stored in the storage module 18, on the basis of the "new" switching level currently calculated by the switching level provider 14. Thus, the value which is updated at this update triggering condition becomes the most recently updated value. The other value is maintained unchanged until a next update triggering condition occurs. If a next update triggering condition occurs, the other value (which then represents the not most recently updated one of the first value and the second value) is updated while the value which is updated upon the preceding update triggering condition remains unchanged. Thus, the values are alternatively updated on consecutive triggering conditions.

Thus, in examples, if both stored values are valid, the oldest one is updated. If only one of the values is valid, the invalid one is updated and a counter associated therewith may be incremented to be higher by 1 than a counter associated with the valid one. If both values are valid, but counters associated with the values indicate there have been no previous updates, a predetermined one of the values, such as the first value, may be updated. If both values are invalid, a predetermined one of the values, such as the first value may be updated.

The non-volatile storage module 18 stores the first value (or instance) 30 and the second value (or instance) 32 of the default switching level in a non-volatile manner, i.e., the values remain stored even in case power is turned off for a longer time, such as a time exceeding 10 s. The non-volatile storage module 18 may comprise any suitable non-volatile memory, such as an EERPOM or a flash memory. The first value and the second value of the default switching level may directly indicate the respective switching level or may indicate information based on which the respective switching level may be derived. The first and second values may be considered as representing calibration values as the same are calculated based on actual measurements of the magnetic field and, therefore, provide for calibration of the default switching level.

In examples, the switching level provider 14 may watch for the occurrence of the update condition and may cause the non-volatile storage module 18 to update the respective value of the default switching level as described herein. The conditions for update trigger are verified at the end of each target wheel rotation. The switching level provider 14 may be configured to read from and write to the non-volatile storage module 18 to obtain required information from the non-volatile storage module and to cause update of the first and second values of the default switching level as described herein.

In examples, the update triggering condition comprises the stipulation that a difference between the switching level calculated during the running mode and the most recently updated valid one of the first and second values of the default switching level is greater than a specific percentage of a peak to peak amplitude of the magnetic field. In examples, the update triggering condition is that the switching level calculated during the running mode deviates more than 3%, e.g., more than 5% or 10%, (when compared to the currently detected peak-to-peak amplitude) from the currently stored most recently updated valid default switching level. Thus, updating the values too often may be avoided. In examples, if there have not been any previous updates or if there is no valid value, this stipulation may be skipped. In examples, the update triggering condition may comprise the stipulation that the magnetic field sensor apparatus is powered on for the first time or that a difference between the switching level calculated during the running mode and the pre-programmed TPO switching level is greater than a specific percentage of a peak to peak amplitude of the magnetic field, such as greater than 3%, 5% or 10%.

In examples, the update triggering condition may additionally comprise one or more further stipulations. A further stipulation may be that a rotational speed of the target wheel influencing the magnetic field is larger than a specific rotational speed. In examples, the specific rotational speed may be 200 or 400 rotations per minute. Thus, storage of wrong calibration values (default switching levels) generated by a target wheel vibration or at start-stop may be avoided. Another stipulation may be that a number of rotations of the target wheel since power up of the magnetic field sensor apparatus is larger than a specific number of rotations. Another stipulation may be that a temperature of the magnetic field sensor apparatus or the storage module is within a specific temperature range so that safe updating can be ensured. Another stipulation may be that a minimum number of consecutive target wheel rotations in which the calculated switching level in the running mode has remained unchanged, such as lies within specific limits, has occurred. Thus, examples permit the respective value of the default switching level to be updated when there are stable operation conditions so that inappropriate updates can be avoided. In examples, all the above stipulations have to be fulfilled to allow the default switching level to be updated. In examples, the update triggering condition may optionally include a command from an external device, such as from an external control unit.

In examples, the storage module is configured to store an indicator indicating a total number of updates, wherein the storage module is configured to adapt the total number of updates after each update of the first or second value of the default switching level. Thus, examples may provide an increased reliability by avoiding that a number of updates larger than a maximum number is performed. Moreover, damaging of the non-volatile memory module may be avoided.

In examples, the indicator comprises a first update counter associated with the first value of the default switching level and a second update counter associated with the second value of the default switching level, wherein the first update counter is changed to the total number of updates if the first value of the default switching level is updated and the second update counter is changed to the total number of updates if the second value of the default switching level is updated so that the update counter associated with the most recently updated one of the first and second values of the default switching value indicates the total number of updates. Thus, the update counter associated with each of the values of the default switching level may have a double functionality of showing which is the most recently updated value on the one hand and indicating the total number of updates on the other hand. In other examples, an additional flag may be stored, such as in the non-volatile memory, which indicates the most recently updated value.

In examples, the storage module and/or the switching level provider is configured to check whether the update of a respective one of the first and second values of the default switching level was successful, to re-try the update of the respective one of the first and second values for at most a specific number of times if the update was not successful, to update the respective other value of the first and second values if the update of the respective one of the first and second values was not successful after the specific number of re-tries, and to set the update counter associated with the other one of the first and second values to a maximum number (maximum counter level). Thus, examples, permit to avoid further updates in the future and to take appropriate measures, such as outputting a warning signal if updating one of the values is no longer possible. Generally, in examples, the storage module may be configured to update one of the first and second values of the default switching level if the total number of updates is not more than a maximum allowed number and to output a warning signal if the total number of updates is more than the maximum allowed number. If the total number of updates is more than the maximum allowed number, no further update of the first and/or second valued is performed.

In examples, the storage module is configured to store associated with each of the first and second values of the default switching level a validity information indicating whether the associated value of the default switching level is valid or not. In such examples, the switching level provider may be configured to check which of the first and second values of the default switching level is the most recently updated valid one using the validity information. In examples, the validity information has a specific relation with the respective value. If the relation is fulfilled the value is valid and if not, the value is not valid (invalid). In examples, the validity information may comprise a copy or an inverted polarity copy of the associated first or second value of the default switching level. In examples, the storage module is configured to store a or the first update counter associated with the first value of the default switching level and a or the second update counter associated with the second value of the default switching level, and wherein the validity information additionally indicate whether the associated update counter is valid or not.

In examples, the storage module is configured to additionally store a pre-programmed default switching level, wherein the switching level provider is configured to provide the pre-programmed default switching level as the switching level if the validity information indicates that the first and second values of the default switching level are not valid. In examples, the pre-programmed default switching level is stored when manufacturing the magnetic field sensor apparatus and is used at a first power-up thereof when there is not yet stored a valid updated value of the default switching level.

In examples, the switching level provider may be configured to provide the switching level based on the most recently updated valid one of the first value of a default switching level and the second value of a default switching level after a short-term power interruption of less than one second. Thus, an additional volatile memory powered by a capacitor or the like for a short period of time may be avoided or may be reduced in size, such as if such a volatile memory it is provided to store the output state of the magnetic field sensor apparatus after the power supply is recovered until a signal path is stable.

Examples of the present disclosure provide a system comprising a magnetic field sensor apparatus as described herein and an electronic control module, wherein the storage module of the magnetic field sensor is configured to store an or the indicator indicating a total number of updates of the first and second values of the default switching level and to store associated with each of the first and second values of the default switching level a or the validity information indicating whether the associated value of the default switching level is valid or not. The electronic control module is configured to check after a re-mount of the magnetic field sensor apparatus whether an update of the first and/or second value was successful based on the validity information after the update and based on the total number of updates before and after the update of the first and/or second value. Thus, examples permit an assessment as to whether a remount was successful and as to whether leaving the magnetic field sensor apparatus for further usage is worthwhile or the apparatus should be replaced and discarded as the total number of updates approaches a maximum number.

In examples, of the present disclosure the non-volatile storage module is configured to store two values or storage instances of the default switching level. The two instances are stored concurrently in separate storage locations so that the same can be accessed separately. The two instances may have different values upon power on of the apparatus as, in case of an updating event or condition, the not most recently updated instance is updated while the other is maintained unchanged.

In examples, each of the two storage instances comprises three fields, which store: a calibrated switching level (i.e., a switching level calculated based on a sensed amplitude of the magnetic field), a validity information and an information regarding the total number of incremental update operations performed so far. All these three fields may be updated for one of the two instances at the opportunity of an update event, such as in a single step. In an example, the validity information may actually be a stored copy or an inverted polarity copy of the switching level in order to ensure low likelihood of regarding the data as valid when the stored data is corrupted.

According to the present disclosure, in order to always have back-up data in case one storage instance gets corrupted, the apparatus is configured to update only one storage instance (the one containing the oldest information based on a number of incremental update operations performed) when the update triggering condition is met. Together with updating one of the two storage instances, the apparatus may update the number of update steps by incrementing the associated update counter by one when compared to the number stored in the update counter of the most recently updated storage instance.

At power up or start-up, the apparatus would use as default switching level the latest valid stored switching level, i.e. the value which was most recently updated. If one storage instance is corrupted, the validity information would no longer indicate that the corresponding switching level is valid and the apparatus would revert to using older data from the other storage instance.

Thus, according to the present disclosure, the number of programming steps performed is lower when compared to a case in which both of two redundant storage instances are updated at each occurrence of an update event. Thus, aging of the non-volatile storage module may be reduced as the number of updates of each storage instance may be reduced by a factor of two. In addition, it results in a shorter term exposure of the storage instance to possible corruption. Additionally, for a possible debug of field returns, the present approach offers a history of the latest two stored switching levels without additional effort.

In case both storage instances would be corrupted, in examples of the present disclosure, the device/apparatus would still be able to use a pre-programmed TPO switching level which was programmed at the manufacturing stage.

Figure 2:
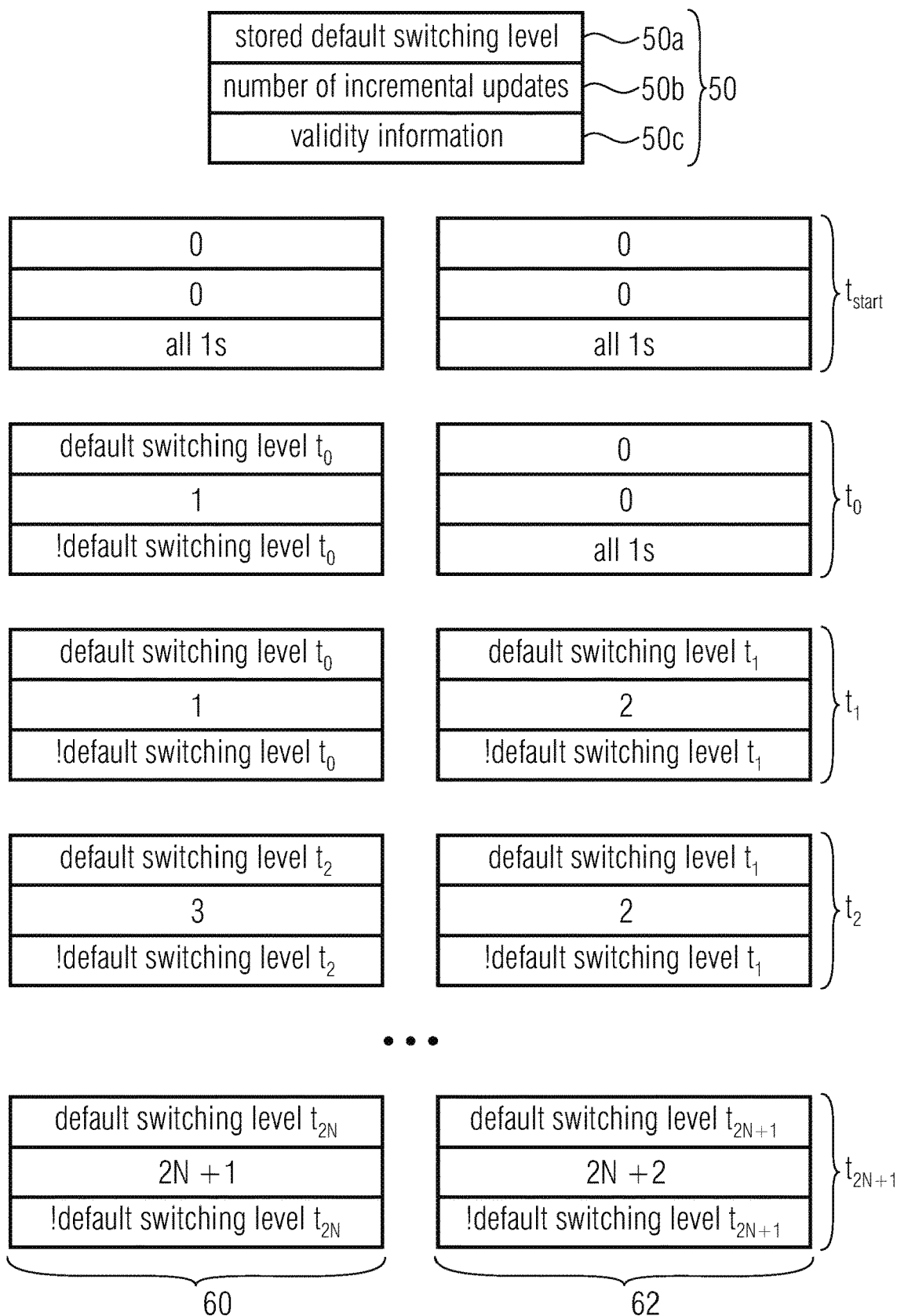
FIG. 2 shows a schematic diagram of an organization of storage data according to an example of the present disclosure.

FIG. 2 shows at 50 an example of an organization of the data of each of the two storage instances. The data include three fields. A first field 50a stores the value of the default switching level, a second field 50b stores the number of incremental updates, and a third field 50c stores validity information. Furthermore, FIG. 2 shows the data of a first storage instance 60 and the data of a second storage instance 62 at different times $t_{start}$, $t_0$, $t_1$, $t_2$, and $t_{2N+1}$. $t_{start}$ represents the original state before a first update of the default switching level is conducted. $t_0$ represents a time after the first update, $t_1$ the time after a second update, $t_2$ the time after a third update and $t_{2N+1}$.

The state at the time $t_{start}$ may correspond to the state after manufacturing the apparatus but prior to take it into operation. In both instances 60 and 62, value 50a and update counter 50b are set to zero. In this example, validity information in field 50c indicate whether the value in field 50a is valid. In the example shown, the valued in field 50a is valid if the validity information in field 50c is an inverted polarity copy of the value stored in field 50a. At the time $t_{start}$ all bits in field 50c are 1s and, therefore, indicate that the value in field 50a is valid. The apparatus may derive from the update counter which is zero for both instances 60 and 62 that the pre-programmed default switching level is to be used upon powering on the apparatus. The pre-programmed default switching level may be stored somewhere else in the non-volatile storage module 18 or in another memory.

In other examples, at time $t_{start}$, all bits in field 50c may be 0s and, therefore, indicate that the value in field 50a is not valid. Thus, the apparatus may recognize that both instances are not valid and, therefore, use the pre-programmed switching level. Thus, in examples, validity information being an identical copy of the value in field 50a may indicate a valid value. In other examples, ECC (error correction code) bits may be calculated over the value of the default switching level (field 50a) or over the value of the default switching level (field 50a) and the update counter (filed 50b), and the ECC bits may be used as validity information.

After a first update triggering condition is fulfilled upon powering on the apparatus, one of the instances 60 and 62 is updated. Generally, the not most recently updated (oldest) instance will be updated. At time $t_{start}$ both updated counters are zero and, therefore, a most recently updated instance does not exist. In such a case, the apparatus may update an arbitrary of the instances or a preselected one thereof. In the example shown, this is the first instance 60. When updating the first instance 60, a calibrated switching level to is stored in field 50a, the number of the update counter is increased to 1 and the proper validity information is stored in field 50c. An inverted validity copy is indicated by a respective exclamation mark in FIG. 2. Instance 62 remains unchanged. The result is shown at time $t_0$ in FIG. 2.

A next update triggering condition occurs between times $t_0$ and $t_1$. At time $t_0$, the update counter of instance 60 is higher than the update counter of instance 62 and, therefore, indicates that instance 60 is the most recently updated instance. Thus, the other (oldest) instance 62 is next updated and instance 60 remains unchanged. When updating instance 62, the newly calibrated value $t_1$ is stored in field 50a of instance 62, the update counter in field 50b of instance 62 is incremented to be higher than the update counter in field 50b of instance 60, such as incremented by two, and the proper validity information are written into field 50c of instance 62.

This procedure is repeated for further updates as shown at times $t_2$ and $t_{2N+1}$ in FIG. 2. Thus, both instances are updated alternatingly in consecutive update triggering conditions.

In case the non-volatile storage (or at least the locations thereof where the respective value of the default switching level is stored) is corrupted, the validity information will no longer fit to the respective value and, upon checking the value, the switching level provider will not recognize the value as being valid.

Figure 3:
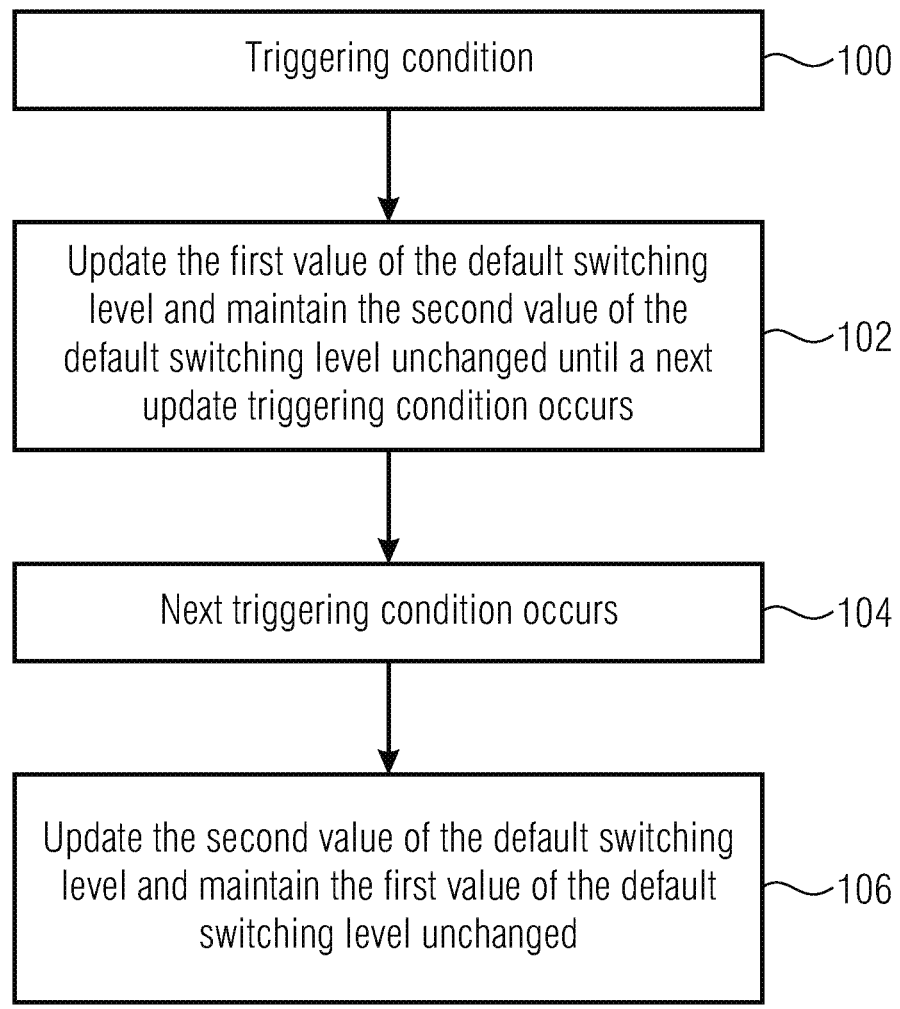
FIG. 3 shows a flow diagram of a method according to an example of the present disclosure.

Examples of the present disclosure provide a corresponding method for updating a default switching level. An update triggering condition occurs at block 100 in FIG. 3. It is to be assumed that the update triggering occurs in a state in which the second value, such as value 50a of the second instance 62, is the most recently updated value. Thus, the first value (which is not the most recently updated value or oldest value) is updated and the second value is maintained unchanged until a next triggering condition occurs, see block 102 in FIG. 3. After updating the first value, a next update triggering condition occurs at block 104 in FIG. 3. Since the first value is now the most recently updated value, the second value is updated at block 106 and the first value remains unchanged.

Figure 4:
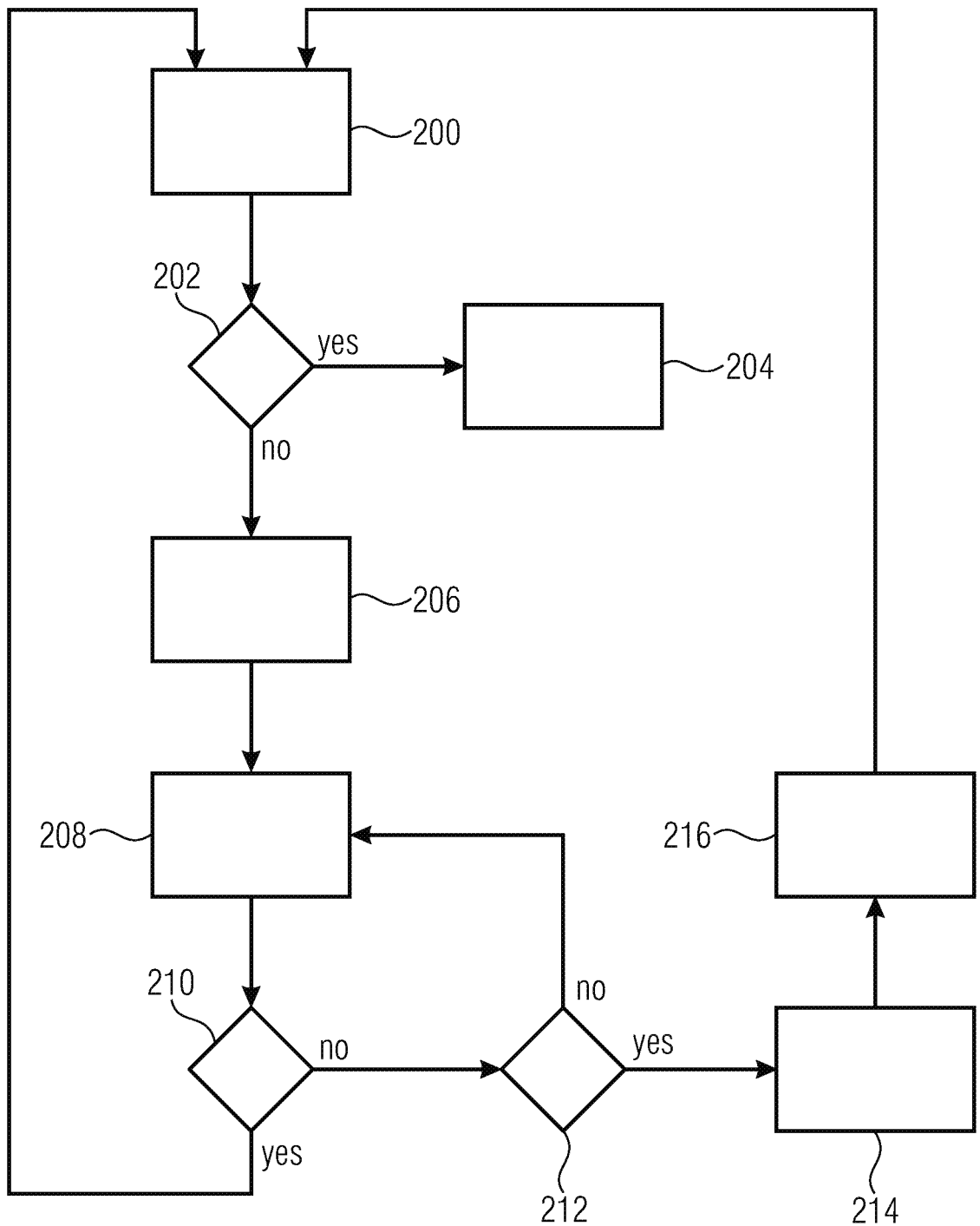
FIG. 4 shows a flow diagram of a method according to an example of the present disclosure.

FIG. 4 shows a flowchart of a method according to another example of the present disclosure. At block 200, an update triggering condition or event occurs. In examples, the conditions (stipulations) for an updated trigger are verified at the end of each target wheel rotation. At block 202, it is checked whether the total number of updates is larger than a maximum number i.e., a maximum allowed number. In examples, this is done by checking the update counters associated with each instance/value of the default switching level. In examples, an update counter stored separately from the first and second instances may be checked. If the total number of updates is larger than the maximum number, no update is performed and the process ends at block 204. In such case, the most recently (latest) updated value of the default switching threshold may be provided by the update provider (and may be used as an initial default switching level). In examples, additionally, a warning may be output at block 204. If the total number of updates is not larger than the maximum number, it is determined at block 206 which value of the default switching level is to be updated. If both values of the default switching level are valid, it is determined that the not most recently updated (oldest) value is to be updated. If one of the values is valid and the other of the values is invalid it is determined that the invalid value is to be updated. If both values are invalid it is determined that a predefined one of the values, such as the first value, is to be updated. At block 208, the corresponding value (determined at block 206) is updated.

Updating in block 208 may include updating fields 50a, 50b and 50c as described above referring to FIG. 2. Upon updating in block 208, it is checked at block 210 whether the update was successful. This may be done by verifying the validity field 50c associated with the updated value or via ECC bits. If the update was successful, the method jumps back to block 200. If the update was not successful, it is checked at block 212 whether a number of retries is larger than a specific number. If the number of retries is not larger than the specific number, updating the same value is retried again at block 208. If the check at block 212 reveals that the number of retries is larger than the specific number, the methods proceeds to block 214 where the update counter of the value which was not updated successfully is set to the maximum number. The specific number may correspond to the maximum number of updates or may be different from the maximum number of updates, such as less than the maximum number of updates. The method proceeds to block 216 where the other value is updated and the update counter of the other value is set to the maximum number. Thereafter, the method may proceed to block 200.

Thus, in examples, the non-volatile storage module can be configured to check successful update of the information in the storage module based on the validity information, such as ECC bits. In case updating of the storage is not successful in one of the storage instances after a maximum defined number of re-tries, the device updates the other storage instance. Optionally, the apparatus can set the number of incremental update operations to the maximum allowed value when observing that one of the storage instances cannot be updated anymore. This idea improves the robustness against aging of the NVM.

In examples, the latest valid stored switching level may be used as default switching level after a short supply interruption, such as an interruption of less than 10 s or less than 1 s, or such as in a range of 100 µs, wherein interruptions in such a range are sometimes referred to as a micro-break. Volatile memories storing updated switching values are generally not able to deal with breaks of between 1 s and 10 s. Thus, examples of the present disclosure may deal with longer breaks if it can hold the correct output signal by separate means since the threshold information is not lost. This would allow keeping the duty cycle deviations after a supply disturbance within the accepted EMC class A criterion (EMC=(electromagnetic compatibility), e.g. 10% accepted duty cycle deviation, until an optimized switching threshold is computed based on one target wheel rotation. Thus, an additional volatile memory to provide the calibrated switching level after such a short supply interruption is not provided in examples of the present disclosure.

In a system according to the present disclosure, an electronic control unit, ECU, which may be part of the magnetic field sensor apparatus or may be separate therefrom, may read from the non-volatile storage module how many incremental updates are still available for the storage after a sensor remount in the service. In order for the apparatus to work correctly after sensor remount, at least one more update should be remaining to adapt the stored switching level to the new mounting position and optionally other update steps to adapt the stored switching level after a lifetime drift. Thus, the ECU output a warning if an additional update is not available and/or if the remaining number of additional updates is below a lower limit. In addition, the ECU could also check in the service if the switching level storage update was successful after a remount based on the information in the two storage instances. For example, the ECU may check if the data is considered valid and if the number of update steps has been incremented.

Thus, examples of the present disclosure permit ensuring a redundancy of threshold (switching level) storage and updating this information in a safe manner in order to ensure phase accuracy at first edges directly after power on of the apparatus/device. Additionally, examples permit using the stored information in order to achieve class A EMC performance. Examples of the present disclosure may be used in camshaft position sensor arrangements, CAM sensor arrangements. Other examples may be used in other magnetic field sensor applications in which a sensor signal is to be compared to a threshold and in which the threshold is to be adapted, calibrated, to respective operational conditions.

In examples, the apparatus may be configured to compare the signal to a plurality of thresholds/switching levels. According to examples, the switching level provider may be adapted to provide each of the plurality of switching levels as described herein, wherein for each switching level, a first and second value/instance may be updated as described herein.

In examples, programming the switching threshold by a self-triggered operation permits reaching a good phase accuracy on first edges of the sensor signal and it permits skipping a step of pre-programming a start-up threshold (TPO threshold) at the customer site. Rather, in examples, pre-programming a pre-programmed default switching level at the manufacture site is sufficient. In examples, using the most recently updated switching level stored in the non-volatile storage module as switching threshold after a short supply interruption allows reaching class A EMC performance within a lower additional area versus current solutions.

Examples of the present disclosure may be applied to sensor applications, such as camshaft sensors, in which variations of a magnetic field, such as caused by a rotation of a target wheel, are mapped into a switching pattern in an output signal. To this end, a sensor signal is compared to at least one threshold and the threshold is adapted to ensure independence of phase accuracy of the switching pattern from an air-gap between the sensor and the target wheel, from run-out, etc. A final value of the threshold that ensures small phase errors is only known when the magnetic field sensor apparatus is mounted at its final destination relative to the target wheel, such as in the motor. The present disclosure provides an approach of updating a default switching level to be used upon power on of the magnetic field sensor device. Examples may provide validity and redundancy checks with less non-volatile storage space. In case of a corrupted non-volatile memory, examples provide additional storage of a pre-programmed TPO switching level, which permits re-calibration of the apparatus. Examples permit a better debug capability for field returns. Examples may achieve a graceful degradation behavior in case the non-volatile memory starts failing at the end of lifetime since the apparatus/device does not try unlimited reprogramming in case of unsuccessful updating/programming of one instance. Examples further permit using stored non-volatile memory data to improve EMC performance after short supply drops as a minor duty cycle deviation is allowed temporarily while still fulfilling the EMC class A criterion. Examples permit safe handling of a sensor remount in the service as an ECU can check the number of remaining operations and can also check after one power up after remount whether the non-volatile memory has been re-programmed to the new mounting air-gap.

In examples, the magnetic field sensor apparatus may be implemented as an integrated circuit. In examples, at least parts of the magnetic field sensor apparatus and the system (such as processing circuit 22, switching level provider 14, memory 18 and comparator 16) may be implemented using any suitable circuit structures such as microprocessor circuits, ASIC circuits (ASIC=application specific integrated circuit), CMOS circuits (CMOS=complementary metal oxide semiconductor), etc. In examples, at least parts of the components of the magnetic field sensor apparatus and the system may be implemented as a combination of hardware structures and machine-readable instructions. In examples, the magnetic field sensor apparatus may comprise a processor and memory storing machine readable instructions, which cause the processor to perform methods disclosed herein when executed on by the processor. Examples of the present disclosure may be implemented as machine readable instructions that, when executed by a processor, cause the processor to perform a method as disclosed herein. Thus, depending on certain implementation requirements, embodiments can be implemented in hardware or in machine readable instructions or at least partially in hardware or at least partially in machine readable instructions. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system or processor such that the respective method is performed.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, inventive subject matter may lie in less than all features of a single disclosed example. Thus, the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims Such combinations are proposed herein unless it is stated that a specific combination is not intended. Furthermore, it is intended to include also features of a claim to any other independent claim even if this claim is not directly made dependent to the independent claim.

The above described examples are merely illustrative for the principles of the present disclosure. It is understood that modifications and variations of the arrangements and the details described herein will be apparent to others skilled in the art. It is the intent, therefore, to be limited only by the scope of the pending patent claims and not by the specific details presented by way of description and explanation of the examples herein.

What is claimed is:

1. A magnetic field sensor apparatus, comprising:
   a sensor signal generator configured to generate a sensor signal responsive to a magnetic field;
   a switching level provider configured to provide a switching level, wherein the switching level provider is configured to provide, during a power up mode, the switching level based on a most recently updated valid one of a first value of a default switching level and a second value of the default switching level, and to calculate, during a running mode, the switching level based on the sensor signal;
   a comparator configured to compare the sensor signal to the switching level; and
   a non-volatile storage module configured to:
      store the first value of the default switching level and the second value of the default switching level, and
      if an update triggering condition occurs, update a not most recently updated one of the first value and the second value of the default switching level and maintain the most recently updated one of the first and the second values of the default switching level unchanged until a next update triggering condition occurs so that the first and the second values of the default switching level are updated alternately on consecutive triggering conditions.

2. The magnetic field sensor apparatus of claim 1, wherein the non-volatile memory module is configured to update the not most recently updated one of the first value and the second value of the default switching level and maintain the most recently updated one of the first and the second values of the default switching level unchanged until a next update triggering condition occurs, so that the first and the second values of the default switching level are updated alternately on consecutive triggering conditions if both values of the default switching level are valid in the consecutive triggering conditions, and is further configured to:
   if an update triggering condition occurs and one of the first value and the second value of the default switching level is valid and the other of the first value and the second value of the default switching level is invalid, update the invalid one of the first value and the second value of the default switching level; and
   if an update triggering condition occurs and both of the first value and the second value of the default switching level are invalid, update a predetermined one of the first value and the second value of the default switching level.

3. The magnetic field sensor apparatus of claim 1, wherein the update triggering condition comprises the stipulation that a difference between the switching level calculated during the running mode and the most recently updated one of the first and the second values of the default switching level is greater than a specific percentage of a peak-to-peak amplitude of the magnetic field.

4. The magnetic field sensor apparatus of claim 3, wherein the update triggering condition additionally comprises at least one of the following stipulations:
   a rotational speed of a target wheel influencing the magnetic field is larger than a specific rotational speed;
   a number of rotations of the target wheel since power up of the magnetic field sensor apparatus is larger than a specific number of rotations;
   a temperature of the magnetic field sensor apparatus or the storage module is within a specific temperature range; and
   a minimum number of consecutive target wheel rotations in which the calculated switching level in the running mode has remained unchanged.

5. The magnetic field sensor apparatus of claim 1, wherein the storage module is configured to store an indicator indicating a total number of updates, wherein the storage module is configured to adapt the total number of updates after each update of the first value or the second value of the default switching level.

6. The magnetic field sensor apparatus of claim 5, wherein the indicator comprises a first update counter associated with the first value of the default switching level and a second update counter associated with the second value of the default switching level,
   wherein if the first value of the default switching level is updated, the first update counter is changed to the total number of updates, and, if the second value of the default switching level is updated, the second update counter is changed to the total number of updates,
   wherein the first update counter or the second update counter associated with the most recently updated one of the first and the second values of the default switching value indicates the total number of updates.

7. The magnetic field sensor apparatus of claim 6, wherein the switching level provider is configured to determine which of the first and the second values of the default switching level is the most recently updated one using the first and the second update counters.

8. The magnetic field sensor apparatus of claim 6, wherein the storage module is configured to check whether the update of a respective one of the first and the second values of the default switching level was successful, to re-try the update of the respective one of the first and the second values for at most a specific number of re-tries if the update was not successful, to update the other value of the first and the second values if the update of the respective one of the first and the second values was not successful after the specific number of re-tries, and to set the first update counter or the second update counter associated with the other value of the first and the second values to a maximum number.

9. The magnetic field sensor apparatus of claim 8, wherein the storage module is configured to update one of the first and the second values of the default switching level if the total number of updates is not more than the maximum number and to output a warning signal if the total number of updates is more than the maximum number.

10. The magnetic field sensor apparatus of claim 1, wherein the storage module is configured to store associated with each of the first and the second values of the default switching level a validity information indicating whether the associated first value or the associated second value of the default switching level is valid or not, and wherein the switching level provider is configured to check which of the first and the second values of the default switching level is the most recently updated valid one using the validity information.

11. The magnetic field sensor apparatus of claim 10, wherein the validity information comprises a copy or an inverted polarity copy of the associated first value or the associated second value of the default switching level.

12. The magnetic field sensor apparatus of claim 10, wherein the storage module is configured to store the first update counter associated with the first value of the default switching level and the second update counter associated with the second value of the default switching level, and wherein the validity information additionally indicates whether the associated first update counter and the associated second update counter is valid or not.

13. The magnetic field sensor apparatus of claim 10, wherein the storage module is configured to additionally store a pre-programmed default switching level, wherein the switching level provider is configured to provide the pre-programmed default switching level as the switching level if the validity information indicates that the first and the second values of the default switching level are not valid.

14. The magnetic field sensor apparatus of claim 1, wherein the switching level provider is configured to provide the switching level based on the most recently updated valid one of the first value and the second value of the default switching level after a short-term power interruption of less than one second.

15. A system, comprising:
a magnetic field sensor apparatus; and
an electronic control module,
wherein the magnetic field sensor apparatus comprises:
 a sensor signal generator configured to generate a sensor signal responsive to a magnetic field;
 a switching level provider configured to provide a switching level, wherein the switching level provider is configured to provide, during a power up mode, the switching level based on a most recently updated valid one of a first value of a default switching level and a second value of the default switching level, and to calculate, during a running mode, the switching level based on the sensor signal;
 a comparator configured to compare the sensor signal to the switching level; and
 a non-volatile storage module configured to:
  store the first value of the default switching level and the second value of the default switching level, and
  if an update triggering condition occurs, update a not most recently updated one of the first value and the second value of the default switching level and maintain the most recently updated one of the first and the second values of the default switching level unchanged until a next update triggering condition occurs so that the first and the second values of the default switching level are updated alternately on consecutive triggering conditions,
wherein the storage module of the magnetic field sensor is configured to store an indicator indicating a total number of updates of the first and the second values of the default switching level and to store associated with each of the first and the second values of the default switching level validity information indicating whether the associated first value or the associated second value of the default switching level is valid or not,
wherein the electronic control module is configured to check after a re-mount of the magnetic field sensor apparatus whether an update of at least one of the first value or second value was successful based on the validity information after the update and based on the total number of updates before and after the update of the at least one of the first value or second value.

16. A method of updating a default switching level in a magnetic field sensor apparatus, the magnetic field sensor apparatus comprising a sensor signal generator configured to generate a sensor signal responsive to a magnetic field; a switching level provider configured to provide a switching level, wherein the switching level provider is configured to provide, during a power up mode, the switching level based on a most recently updated valid one of a first value of a default switching level and a second value of the default switching level, and to calculate, during a running mode, the switching level based on the sensor signal; a comparator configured to compare the sensor signal to the switching level; and a non-volatile storage module configured to store the first value of the default switching level and the second value of the default switching level, the method comprising:
if an update triggering condition occurs, updating the not most recently updated one of first value and the second value of the default switching level and maintaining the most recently updated one of the first value and the second value of the default switching level unchanged until a next update triggering condition occurs, so that the first and the second values of the default switching level are updated alternately on consecutive triggering conditions.

17. The method of claim 16, wherein updating the not most recently updated one of the first value and the second value of the default switching level and maintaining the most recently updated one of the first and the second values of the default switching level unchanged until a next update triggering condition occurs, so that the first and the second values of the default switching level are updated alternately on the consecutive triggering conditions is performed if both the first and the second values of the default switching level are valid in consecutive triggering conditions, the method further comprising:
if an update triggering condition occurs and one of the first value and the second value of the default switching level is valid and the other of the first value and the second value of the default switching level is invalid, update the invalid one of the first and the second values of the default switching level; and if an update triggering condition occurs and both of the first value and the second value of the default switching level are invalid, update a predetermined one of the first value and the second value of the default switching level.

18. The method of claim 16, further comprising:

storing an indicator indicating a total number of updates and adapting the total number of updates after each update of the first value or the second value of the default switching level.

19. The method of claim 18, wherein the indicator comprises a first update counter associated with the first value of the default switching level and a second update counter associated with the second value of the default switching level, wherein the method further comprises changing the first update counter to the total number of updates if the first value of the default switching level is updated and changing the second update counter to the total number of updates if the second value of the default switching level is updated so that the first update counter or the second update counter associated with the most recently updated one of the first and the second values of the default switching value indicates the total number of updates.

20. The method of claim 19, further comprising:

determining which of the first and the second values of the default switching level is the most recently updated one using the first and the second update counters.

21. The method of one of claim 19, further comprising:

checking whether the update of a respective one of the first and the second values of the default switching level was successful, re-trying the update of the respective one of the first and the second values for at most a specific number of times if the update was not successful, updating the other value of the first and the second values if the update of the respective one of the first and second values was not successful after the specific number of re-tries, and setting the first update counter or the second update counter associated with the other value of the first and the second values to a maximum number.

22. The method of claim 21, further comprising:

updating one of the first and the second values of the default switching level if a total number of updates is not more than the maximum number and outputting a warning signal if the total number of updates is more than the maximum number.

23. The method of claim 17, further comprising:

storing associated with each of the first and the second values of the default switching level a validity information indicating whether the associated first value or the associated second value of the default switching level is valid or not, and checking which of the first and the second values of the default switching level is the most recently updated valid one using the validity information.

24. The method of claim 23, further comprising:

providing a pre-programmed default switching level as the switching level if the validity information indicates that the first and the second values of the default switching level are not valid.

25. The method of claim 17, wherein the switching level is provided based on the most recently updated one of the first value of the default switching level and the second value of the default switching level after a short-term power interruption of less than one second.

26. The method of claim 17, wherein the storage module of the magnetic field sensor is configured to store the indicator indicating a total number of updates of the first and the second values of the default switching level and to store associated with each of the first and the second values of the default switching level the validity information indicating whether the associated first value or the associated second value of the default switching level is valid or not, the method further comprising after a re-mount of the magnetic field sensor apparatus:

checking whether an update of at least one of the first value or the second value was successful based on the validity information after the update and based on the total number of updates before and after the update of the at least one of the first value or second value.

27. A non-transitory computer-readable medium having computer-readable instructions stored thereon which when executed by a computer system cause the computer system to perform a method of updating a default switching level in a magnetic field sensor apparatus, comprising a sensor signal generator configured to generate a sensor signal responsive to a magnetic field; a switching level provider configured to provide a switching level, wherein the switching level provider is configured to provide, during a power up mode, the switching level based on a most recently updated valid one of a first value of a default switching level and a second value of the default switching level, and to calculate, during a running mode, the switching level based on the sensor signal; a comparator configured to compare the sensor signal to the switching level; and a non-volatile storage module configured to store the first value of the default switching level and the second value of the default switching level, the method comprising:

if an update triggering condition occurs, updating the not most recently updated one of first value and the second value of the default switching level and maintaining the most recently updated one of the first value and the second value of the default switching level unchanged until a next update triggering condition occurs, so that the first and the second values of the default switching level are updated alternately on consecutive triggering conditions.

* * * * *